United States Patent [19]
Birkeland et al.

[11] Patent Number: 5,325,000
[45] Date of Patent: Jun. 28, 1994

[54] FREQUENCY MIXING CIRCUIT WITH IMPEDANCE TRANSFORMING POWER COMBINER

[75] Inventors: Joel D. Birkeland, Phoenix; Vijay K. Nair, Mesa, both of Ariz.

[73] Assignee: Motorola, Inc., Schaumburg, Ill.

[21] Appl. No.: 54,484

[22] Filed: Apr. 30, 1993

[51] Int. Cl.$^5$ ............................................. H03K 5/26
[52] U.S. Cl. .................................... 307/529; 328/158; 331/42
[58] Field of Search ................ 307/529, 510; 328/156, 328/158, 129.1; 331/42, 43

[56] References Cited
U.S. PATENT DOCUMENTS

| | | | |
|---|---|---|---|
| 3,305,730 | 2/1967 | Parzen | 307/529 |
| 3,716,730 | 2/1973 | Cerny, Jr. | 307/529 |
| 4,713,556 | 12/1987 | Yamamoto et al. | 307/529 |
| 4,845,389 | 7/1989 | Pyndiah et al. | 307/529 |

Primary Examiner—Timothy P. Callahan
Assistant Examiner—My-Trang Nu Ton
Attorney, Agent, or Firm—Robert D. Atkins

[57] ABSTRACT

A frequency mixer circuit uses an impedance transforming power combiner to sum the power levels of RF and LO input signals and drive an output field effect transistor (FET). The nonlinear transconductance in the FET creates the sum and difference mixing products for providing an IF output signal operating at a frequency equal to the difference between the frequencies of the RF and LO input signals. The power combiner is impedance matched to the gate of the FET in order to minimize reflections back into the power combiner. The impedance transforming power combiner reduces component count and associated physical space requirements of the frequency mixing circuit.

15 Claims, 1 Drawing Sheet

FREQUENCY MIXING CIRCUIT WITH IMPEDANCE TRANSFORMING POWER COMBINER

BACKGROUND OF THE INVENTION

The present invention relates in general to high frequency mixing circuits, more particularly, to an impedance transforming power combiner operating in a frequency mixing circuit.

Frequency mixing circuits are commonly used in high frequency applications such as hand-held and cellular telephones and portable radios. A frequency mixing circuit downconverts the frequency of a radio frequency (RF) input signal to produce an intermediate frequency (IF) output signal. The RF signal is downconverted by mixing it with a local oscillator (LO) signal to produce the IF signal having a lower frequency equal to the difference between the LO signal frequency and the RF signal frequency.

A conventional mixer may comprise a power combiner for summing the power levels of the RF signal and the LO signal and processing the summation through an impedance matching circuit to the gate of a field effect transistor (FET). The impedance matching circuit provides a matching impedance at the gate of the FET to minimize reflections and associated insertion loss. The LO signal modulates the RF signal at the gate of the FET and produces sum and difference mixing products from the nonlinear transconductance of the FET. The IF signal is obtained by isolating the desired difference frequency ($LO_{freq} - RF_{freq}$) at the drain of the FET.

The power combiner and the impedance matching circuit as practiced in the prior art typically include a network of large inductors and capacitors which consume large physical areas. Inductors require most of the allocated space. The problem is especially acute for integrated circuit applications. It is desirable to simplify the design and minimize the space requirements of the power combiner and impedance matching circuit in the mixer.

Hence, a need exists for an improved frequency mixing circuit having a power combiner and impedance matching circuit requiring less physical area in an integrated circuit.

DETAILED DESCRIPTION OF THE PRIOR ART

Figure 1:
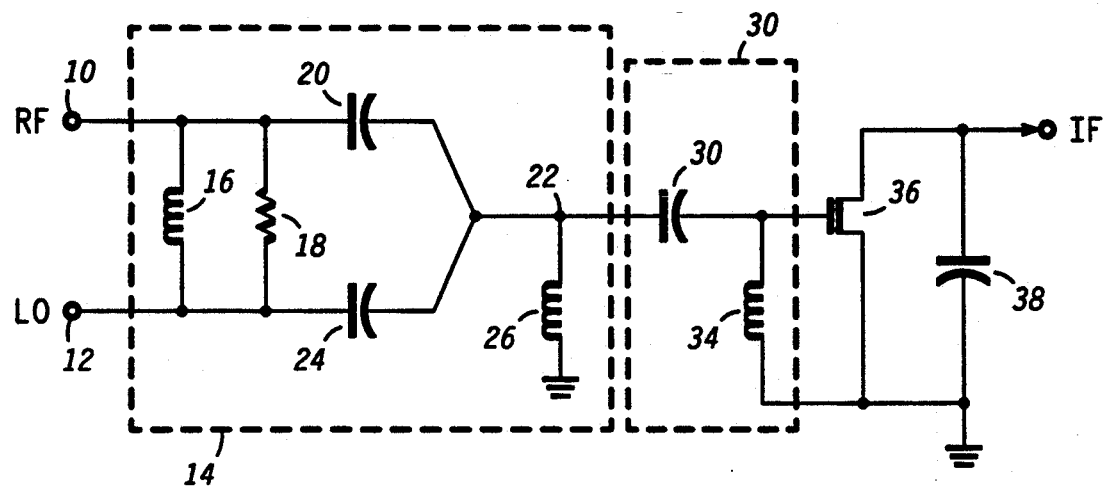
FIG. 1 is a schematic diagram illustrating a conventional power combiner and impedance matching circuit known in the prior art.

A conventional frequency mixing circuit is shown in FIG. 1 where the RF signal and the LO signal are applied at terminals 10 and 12 of power combiner 14. Inductor 16 and resistor 18 are coupled between terminals 10 and 12. Capacitor 20 is coupled between terminal 10 and node 22, while capacitor 24 is coupled between terminal 12 and node 22. Inductor 26 is coupled between node 22 and ground potential. The output of power combiner 14 is coupled to the impedance matching circuit 30 which includes capacitor 32 and inductor 34 for providing a matched impedance at the gate of FET 36. The LO signal modulates the RF signal at the gate of FET 36 and generates the sum and difference mixing products from the nonlinear operation of FET 36. The IF output signal frequency may be isolated by shunt capacitor 38 as the difference frequency $LO_{freq} - RF_{freq}$ at the drain of FET 36.

A significant problem with the configuration shown in FIG. 1 is the area required to realize the frequency mixer on a monolithic integrated circuit. The operating frequency is typically 1.9 GHz for the LO signal and 1.8 GHz for the RF signal leaving the IF signal at 100 MHz. Most notable is the size of inductors 16, 26 and 34 having areas of approximately 0.1225, 0.0756 and 0.1225 cm$^2$, respectively. It is desirable to minimize the area allocated for the power combiner and impedance matching circuit in the integrated circuit, and in particular the inductors contained therein.

DETAILED DESCRIPTION OF THE PREFERRED EMBODIMENT

Figure 2:
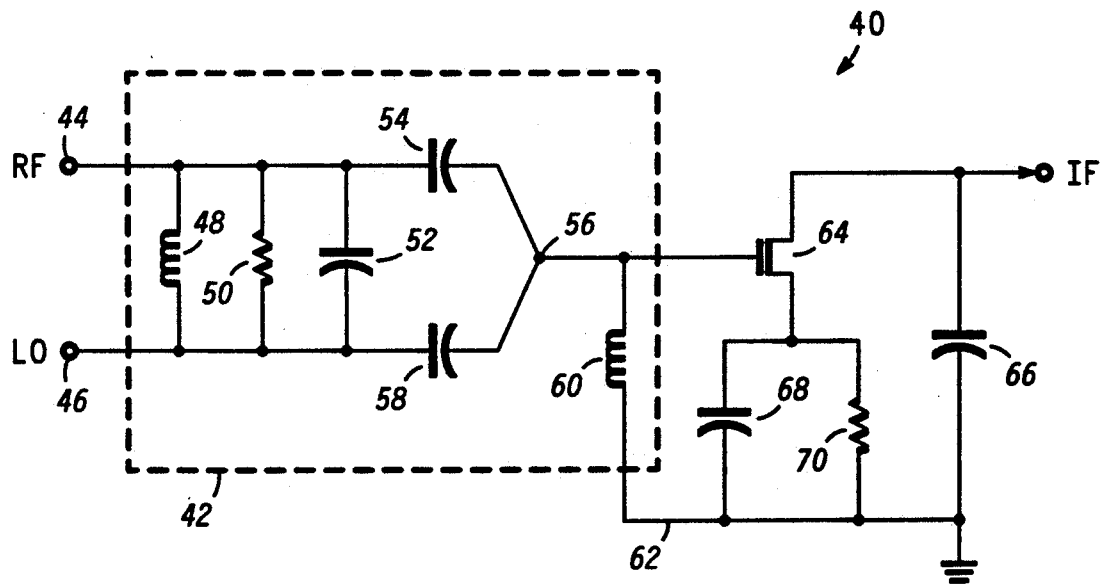
FIG. 2 is a schematic diagram illustrating an impedance transforming power combiner in a frequency mixer.

Turning to FIG. 2, frequency mixer 40 with an impedance transforming power combiner 42 is shown suitable for manufacturing as an integrated circuit using conventional integrated circuit processes. Power combiner 42 receives the RF signal at terminal 44 operating at say 1.8 GHz with power levels ranging from $-10$ to $-80$ dBm into a 50 ohm load. An LO signal is applied at terminal 46 operating at 1.9 GHz with a power level of $-7$ dBm into a 50 ohm load. Inductor 48, resister 50 and capacitor 52 are coupled in parallel between terminal 44 and terminal 46. Inductor 48 is set to a value of 9.3 nanohenries (nH), and resistor is 100 ohms, while capacitor 52 is selected at 0.55 picofarads (pf). Inductor 48 requires approximately 0.15 cm$^2$. A capacitor 54 with a value of 0.55 pf is coupled between terminal 44 and node 56, while capacitor 58 with a value of 0.55 pf is coupled between terminal 46 and node 56. Inductor 60 is coupled between node 56 and power supply conductor 62 operating at ground potential. Inductor 60 is selected at 4.1 nH covering an area of 0.0825 cm$^2$.

The output signal from power combiner 42 represents a summation of power levels from the RF signal and the LO signal and provides an impedance matched drive signal to the gate of field effect transistor (FET) 64. That is, the output impedance of power combiner 42 is matched to the resistive and reactive gate impedance of FET 64 (say 500 ohms) to provide maximum power transfer and avoid reflections back through the power combiner to minimize insertion loss.

FET 64 may be implemented as a discrete Metal Semiconductor Field Effect Transistor (MESFET) using gallium arsenide (GaAs) for RF and microwave frequency applications up to say 800 MHz. Applications above 800 MHz are better suited for monolithic microwave integrated circuit (MMIC) fabrication. Transistor 64 may also be implemented as a High Electron Mobility Transistor (HEMT). Capacitor 66 is coupled between the drain of FET 64 and power supply conductor 62 for shunting high frequencies to ground. In addition, capacitor 68 and resistor 70 are coupled in parallel between the source of FET 64 and power supply conductor 62. Resistor 70 sets the bias operating point of FET 64 while capacitor 68 provides RF bypass for resistor 70.

In operation, the LO signal turns FET 64 on and off by sweeping back and forth across its nonlinear transconductance region of operation. The RF signal is amplified according to the operating point on the transconductance curve. The LO signal thus modulates the RF signal with a voltage swing at the gate of FET 64 of say 200 millivolts. The sum and difference mixing products are generated in FET 64 due to its nonlinear transconductance when biased near pinch-off where transconductance non-linearities are large. The IF signal frequency may be obtained at the drain of FET 64 by appropriate filtering through shunt capacitor 66 (4 pf) to isolate the lower frequency difference product as the frequency of the LO signal less the frequency of the RF signal (1.9 GHz LO−1.8 GHz RF=100 MHz IF).

In addition, by varying the values of the components in power combiner 42, the ratio of the RF power to LO power may be changed. For example, by selecting inductor 48 at 10.7 nH, resistor 50 at 150 ohms, capacitors 52 and 54 at 0.6 pf, capacitor 58 at 0.3 pf and inductor 60 at 5.2 nH, a unity ratio of the RF power to LO power may be achieved at the inputs of power combiner 42 that will result in a 2:1 power ratio at the gate of FET 64. The RF impedance at input terminal 46 becomes 100 ohms, while the RF impedance at terminal 44 remains 50 ohms.

Thus, impedance transforming power combiner 42 performs the functions of (1) summing the RF and LO signals while isolating terminals 44 and 46, and (2) transforming their 50 ohm impedances to match the gate impedance of FET 64 which provides maximum power transfer and minimum insertion loss.

In comparison to the prior art mixer shown in FIG. 1, the present invention provides an additional capacitor coupled between terminals 44 and 46 while eliminating impedance matching circuit 30 (most significantly inductor 34) shown in FIG. 1. The simplification reduces number of components in power combiner 42 which saves area on the integrated circuit application. The prior art mixer requires approximately 0.3206 cm$^2$ for inductors 16, 26 and 34, whereas the impedance transforming power combiner 42 of the present invention utilizes only 0.2325 cm$^2$ for inductors 48 and 60; a 27% reduction in allocated area for inductors.

While specific embodiments of the present invention have been shown and described, further modifications and improvements will occur to those skilled in the art. It is understood that the invention is not limited to the particular forms shown and it is intended for the appended claims to cover all modifications which do not depart from the spirit and scope of this invention.

What is claimed is:

1. A frequency mixing circuit, comprising:
   a first inductor coupled between first and second input terminals at which is applied an RF input signal and a LO input signal respectively;
   a first resistor coupled between said first and second input terminals;
   a first capacitor coupled between said first and second input terminals;
   a second capacitor coupled between said first input terminal and a first node;
   a third capacitor coupled between said second input terminal and said first node;
   a second inductor coupled between said first node and a first power supply conductor; and
   a transistor having a gate, a drain and a source, said gate being coupled to said first node, said source being coupled to said first power supply conductor, said drain providing an output signal of the frequency mixing circuit.

2. The frequency mixing circuit of claim 1 wherein said transistor is a field effect transistor.

3. The frequency mixing circuit of claim 1 further including a second resistor coupled between said source of said transistor and said first power supply conductor.

4. The frequency mixing circuit of claim 3 further including a fourth capacitor coupled between said source of said transistor and said first power supply conductor.

5. The frequency mixing circuit of claim 4 further including a fifth capacitor coupled between said drain of said transistor and said first power supply conductor.

6. A frequency mixing circuit, comprising:
   a power combiner having first and second input terminals for receiving an RF input signal and a LO input signal respectively, said power combiner including,
      (a) a first inductor coupled between said first and second input terminals,
      (b) a first resistor coupled between said first and second input terminals,
      (c) a first capacitor coupled between said first and second input terminals,
      (d) a second capacitor coupled between said first input terminal and an output of said power combiner a first node,
      (e) a third capacitor coupled between said second input terminal and said first node, and
      (f) a second inductor coupled between said first node and a first power supply conductor; and
   a transistor having a gate, a drain and a source, said gate being coupled to said first node, said source being coupled to said first power supply conductor, said drain providing an output signal of the frequency mixing circuit.

7. The frequency mixing circuit of claim 6 wherein said transistor is a field effect transistor.

8. The frequency mixing circuit of claim 7 further including a second resistor coupled between said source of said transistor and said first power supply conductor.

9. The frequency mixing circuit of claim 8 further including a fourth capacitor coupled between said source of said transistor and said first power supply conductor.

10. The frequency mixing circuit of claim 9 further including a fifth capacitor coupled between said drain of said transistor and said first power supply conductor.

11. An integrated frequency mixing circuit, comprising:
   a first inductor coupled between first and second input terminals at which is applied an Rf input signal and a LO input signal respectively;
   a first resistor coupled between said first and second input terminals;
   a first capacitor coupled between said first and second input terminals;
   a second capacitor coupled between said first input terminal and a first node;
   a third capacitor coupled between said second input terminal and said first node;
   a second inductor coupled between said first node and a first power supply conductor; and
   a transistor having a gate, a drain and a source, said gate being coupled to said first node, said source being coupled to said first power supply conductor, said drain providing an output signal of the frequency mixing circuit.

12. The frequency mixing circuit of claim 11 wherein said transistor is a field effect transistor.

13. The frequency mixing circuit of claim 11 further including a second resistor coupled between said source of said transistor and said first power supply conductor.

14. The frequency mixing circuit of claim 13 further including a fourth capacitor coupled between said source of said transistor and said first power supply conductor.

15. The frequency mixing circuit of claim 14 further including a fifth capacitor coupled between said drain of said transistor and said first power supply conductor.

* * * * *